United States Patent [19]

Smyth et al.

[11] Patent Number: 5,449,916
[45] Date of Patent: Sep. 12, 1995

[54] ELECTRON RADIATION DOSE TAILORING BY VARIABLE BEAM PULSE GENERATION

[75] Inventors: Dennis L. Smyth; Gerry Frketich, both of Deep River, Canada

[73] Assignee: Atomic Energy of Canada Limited, Ottawa, Canada

[21] Appl. No.: 302,036

[22] Filed: Sep. 9, 1994

[51] Int. Cl.6 .............................................. H01J 37/30
[52] U.S. Cl. ..................... 250/398; 250/400; 250/492.3
[58] Field of Search ................ 250/398, 400, 492.3

[56] References Cited

U.S. PATENT DOCUMENTS

| | | | |
|---|---|---|---|
| 2,602,751 | 7/1952 | Robinson | 99/221 |
| 2,680,815 | 6/1954 | Burrill | 250/49.5 |
| 2,729,748 | 1/1956 | Robinson | 250/49.5 |
| 3,066,238 | 11/1962 | Arndt | 315/22 |
| 3,965,434 | 6/1976 | Helgesson | 250/492.3 |
| 4,367,412 | 1/1983 | Cheever | 250/492.3 |
| 4,457,803 | 7/1984 | Takigawa | 156/626 |
| 4,551,606 | 11/1985 | Inoue | 219/121 EA |
| 4,652,763 | 3/1987 | Nablo | 250/492.3 |
| 4,726,046 | 2/1988 | Nunan | 250/492.3 |
| 4,845,370 | 7/1989 | Thompson et al. | 250/492.3 |
| 4,983,849 | 1/1991 | Thompson et al. | 250/492.3 |
| 5,177,367 | 1/1993 | Suzuki | 250/492.2 |
| 5,401,973 | 3/1995 | McKeown et al. | 250/492.3 |

OTHER PUBLICATIONS

"Impela: An Industrial Acceleration Family", Ungrin, et al., Presented at 1988 EPAC Conference in Rome.
"The Impela Control System", Lawrence, et al., Presented at 1988 EPAC Conference in Rome.
"Controlled Magnet Excitation for Electron Beam Scanning in Industrial Irradiators", White, et al., 1990 EPAC Conference in Nice.
"Energy Control of the Impela Series of Industrial Accelerators" Hare, et al., Nuclear Instruments and Methods in Physics Research B50 (1990) pp. 470–433 North Holland.
"Pulsed-Linac Synchronization Using an Embedded Micro-Controller", Craig, et al., 1992 Linac (Linear Accel.) Conference in Ottawa.

*Primary Examiner*—Jack I. Berman
*Attorney, Agent, or Firm*—Sughrue, Mion, Zinn, Macpeak & Seas

[57] ABSTRACT

A method and apparatus for controlling the delivered dose across a target area from an electron beam produced by a high energy, high power pulsed rf linear accelerator. Pulse width modulation as a function of scan position is applied to the rf drive pulses of the accelerator operated in a long pulse mode and fast feedback control is used to maintain uniform rf field intensity on an intra-pulse basis. In an alternative embodiment, rf drive pulses are inhibited as a function of scan position.

12 Claims, 10 Drawing Sheets

ELECTRON RADIATION DOSE TAILORING BY VARIABLE BEAM PULSE GENERATION

The present invention relates to electron beam dose control in a high energy, high power pulsed linear accelerator.

BACKGROUND OF THE INVENTION

In an industrial irradiation process using high energy electrons (5–10 MeV) dose uniformity throughout a product is an important requirement. A high uniformity and hence low "max/min ratio" allows the entire product volume to receive the minimum required dose with few areas of overdose, where damage to the product may result. Maintaining a uniform absorbed dose just above the minimum required also results in maximum economic use of the delivered beam power.

Maintaining dose uniformity in a homogeneous medium is relatively simple using a uniform scanned beam through which the product is conveyed. However, significant variations in the effective thickness and density of packages that are presented to the irradiation beam can be expected to occur with non-homogeneous products. These variations can be minimized or highly accentuated depending upon the manner in which the materials are packaged.

It is known that a non-uniform dose distribution may be achieved with a non-linear scan-magnet drive waveform for simple product geometry variations. Other common methods of varying the absorbed dose across a product include the use of beam absorbing masks in front of the product, beam deflectors and the use of multiple beams, either from the same or different sources, directed onto different areas or sides of the product. Scan drive waveform manipulation is limited by the electrical characteristics of the magnet and the beamline magnetic optics. Masking and deflector techniques require the use of mechanical devices and a means of changing these devices, either manually or remotely, for different product configurations. In general, these methods depend on manipulation of the beam as delivered from the source, offer coarse adjustment to the dose field map and may result in poor beam use efficiency, particularly in the case of masking. In addition cooling of masks and deflectors is often required for high power beams.

Attempts have been made to vary average beam power delivered to a target by beam modulation. In U.S. Pat. No. 4,457,803 Takigawa, there is described a method for controlling a focused ion beam for etching micropatterns on silicon wafers for producing semiconductors. Etching depth is adjusted by controlling etching time by applying a variable blanking signal to blanking electrodes adapted to turn off the ion beam. In U.S. Pat. No. 4,551,606 Inoue, there is described a similar method of controlling beam power dissipated in a workpiece by controlling the width of a group of uniform pulses. Both Takigawa and Inoue deal with relatively low particle energy beams that are used for surface effects only. The techniques described are used with direct current (dc) machines in which the beam is simply turned on and off at the source. The beam power absorbed is a function of dwell time of the beam at a particular location on the target which is located inside the beam source vacuum envelope.

A practical industrial irradiator must produce a beam of high energy particles for deep penetration and of sufficient current density (power) to process large volumes of product. A high power linear accelerator (linac) is a known method of achieving such beams. A linac consists of a series of resonant cavities in which microwave power is used to establish an electromagnetic field that imparts energy to the particle beam as it traverses the cavities. The resonant frequency of the cavities is influenced by the beam and requires the beam for efficient coupling of rf power to the accelerator structure. Accordingly, the solution of simply switching on and off the source as described in Takigawa and Inoue is not suitable to high power, high energy linear accelerators.

SUMMARY OF THE INVENTION

It is an object of the present invention to provide a method and apparatus for controlling the delivered dose across a target area from an electron beam produced by a high energy, high power pulsed rf linear accelerator.

In accordance with one aspect of the invention, this object is achieved by scanning the electron beam across a target area at a scan frequency effective to produce a series of irradiated spots across the target area; sensing the scan position, varying the width of the rf drive pulses as a function of scan position to control the delivered dose distribution across said target area.

In accordance with another aspect of the invention, this object is achieved by scanning the electron beam of a high energy, high power pulsed rf linear accelerator across a target area at a scan frequency and pulse repetition rate effective to produce a series of irradiated spots across the target area; sensing the scan position, inhibiting rf drive pulses as a function of scan position to control the delivered dose distribution across said target area.

In accordance with another aspect of the invention, it is preferred to operate the accelerator in a long pulse mode, sensing the rf field intensity in the accelerator and using fast feedback control to maintain uniform rf field intensity on an intra-pulse basis.

BRIEF DESCRIPTION OF THE DRAWINGS

The foregoing and other features of the invention will become more apparent from the following description in which reference is made to the appended drawings, wherein.

DESCRIPTION OF THE PREFERRED EMBODIMENT

Figure 1:
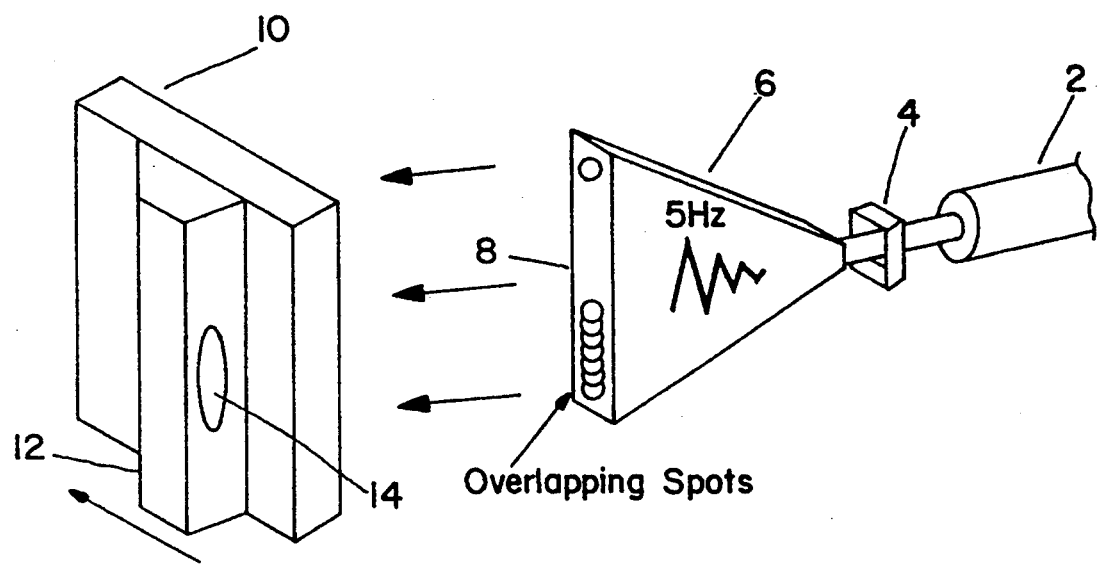
FIG. 1 is a perspective view of a non-uniform product being moved past the scan horn of a pulsed linear accelerator.

FIG. 1 illustrates the use of a linear accelerator to irradiate a product of non-uniform dimensions. Linear accelerator 2 accelerates electrons to form a beam of predetermined energy and power. The beam passes out of the accelerator structure and through scan magnet 4 which sweeps it in a predetermined manner. The beam passes out scan horn 6 through exit window 8 onto product 10 which is moved past the window on a conveyor (not shown). The electron beam is magnetically swept back and forth across the window at a rate that is slow relative to the pulse duration. Hence, there are many overlapping beam 'spots' across the window. The long pulse linear accelerator described below which is particularly suitable to the practice of this invention uses a slow scan rate of, for example, 5 Hz in a scan horn having an 80 cm titanium exit window, producing a series of overlapped exposure spots of about 2 cm diameter.

In order to achieve high uniformity of absorbed dose over non-uniform work product 10, it is necessary to vary the dose distribution across the scan in order to account for thicker portion 12 and aperture 14 in work product 10. In accordance with conventional practice, the control of dose across the scan direction is achieved by distorting the drive waveform to scan magnet 4. However, the inductance (inertia) of the scan magnet limits the rate at which this method can alter the dose pattern. In accordance with one aspect of the present invention, the dose distribution across the scan is varied by modulating the beam pulse width on a pulse-by-pulse basis.

Figure 2:
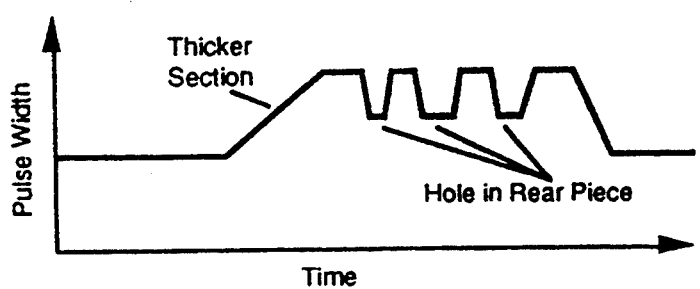
FIG. 2 is a graphical representation of the variation in pulse width as against time that could be used to vary the dose distribution in the non-uniform product illustrated in FIG. 1.

FIG. 2 illustrates how the beam pulse width would be modulated to achieve the desired dose distribution for work product 10 of FIG. 1. FIG. 2 illustrates pulse width vs. time of scan (or position). During irradiation of the thin sections of work product 10, short pulse are used. As the thicker portion 12 passes in front of window 8, the beam pulse width is increased over the full scan width. As aperture 14 in thicker portion 12 passes in front of window 8, the pulse width is reduced only during the time that the beam is directed at the aperture.

In order to effectively use pulse width modulation of the rf drive as a means of controlling delivered dose, the linear accelerator must be capable of producing rf drive pulses having a duration that is variable between wide limits so as to permit effective control of delivered dose. In addition, it is desirable that the linear accelerator be capable of operating in a long pulse mode so as to simplify the application of pulse width modulation. However, with the use of long pulse lengths, intolerable intra-pulse variations in delivered beam can result. For example, klystron gain change due to power supply droop over the long pulse duration can induce unacceptable beam variations.

In co-pending U.S. patent application Ser. No. 07/986,148, now U.S. Pat. No. 5,401,973, there is described a new type of industrial linear accelerator using an L-band single accelerator structure with a Wehnelt controlled electron gun, a graded-$\beta$ capture section directly coupled to a $\beta=1$ section. The long pulse technology developed permits the use of relatively low accelerating gradients, low beam currents, low klystron voltage and low peak power in a linear accelerator while maintaining high average beam power. Intrapulse control of delivered beam is achieved by driving the accelerator with a low peak-power, modulated-anode klystron operated in a long pulsed mode. The amplitude of the electric field is controlled using a magnetic field probe to extract some of the power of the cavity, using a crystal detector to measure the amplitude and, after comparing with a voltage set-point, sending a signal to the rf drive of the klystron to adjust the klystron output. The long pulse length, greater than about 40 $\mu$s, provides sufficient time to permit regulation of the drive power to the klystron and hence control of the beam energy at the energy setpoint during pulses by the use of a fast feedback control system. In addition, the use of long pulse lengths and the ability to control the energy of the accelerated electrons during the pulse permits the use of the length of the pulse as a variable to control the average power of the beam without changing the physics of the process. The field gradient, the peak power and the current all remain the same. To vary the power of the accelerator at constant energy, only the pulse length need be adjusted. The use of long rf pulse widths in association with fast feed-back control permits pulse width to be as a variable not only to control beam power about a set-point, but also permits the use of pulse width modulation in a high power pulsed linear accelerator to generate a non-uniform scanned beam dose profile and maintain tight control of beam energy. Thus dose tailoring by rf drive pulse width modulation can be accomplished at power levels not previously possible.

Figure 3:
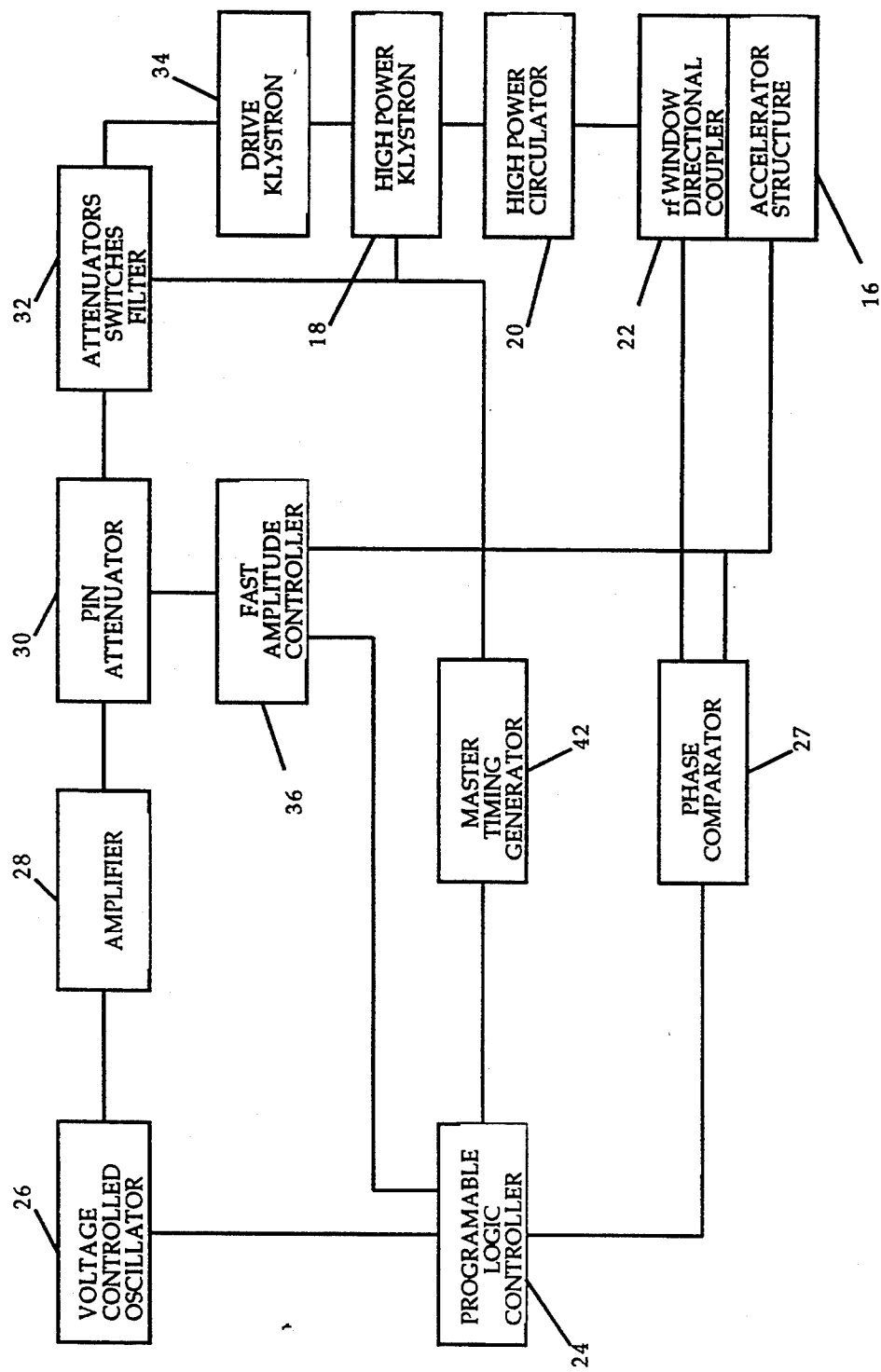
FIG. 3 is a schematic diagram of a long pulse linear accelerator having fast feedback control of rf drive.

FIG. 3 illustrates in schematic form the basic operating components of a long pulse linear accelerator that can be used in the method and apparatus of the present invention. A complete description of the linear accelerator is provided in copending U.S. patent application Ser. No. 07/986,148 which is incorporated herein by reference. Accelerator structure 16 includes an L-band single accelerator structure having at one end a Wehnelt controlled electron gun which injects electrons into a graded-$\beta$ capture section which is directly coupled to a $\beta=1$ accelerator section. The graded-$\beta$ capture section is designed to accelerate and form beam bunches synchronized with the microwave accelerating fields. The $\beta=1$ accelerator section is composed of a series of identical coupled microwave cavities which resonate in the $\pi/2$ mode and accelerate the electrons with rf power. A low stress rf system includes a modulated anode high power klystron 18 operated in a long pulse mode (a pulse longer than about 40 $\mu$S), a high power circulator 20 and rf window/directional coupler 22 to generate the electromagnetic field within the accelerator structure.

Programmable logic controller (PLC) 24 provides centralized control of the accelerator. The frequency of voltage controlled oscillator (VCO) 26 is adjusted by PLC 24 to match the resonant frequency of accelerator structure 16. The mismatch between the driving frequency of VCO 26 and the resonant frequency of accelerator structure 16 is sensed by phase comparator 27 which compares the phase difference of the rf field in accelerator structure 16 to that in rf window directional coupler 22. The output of phase comparator 27 is used by PLC 24 to adjust the frequency of VCO 26 to track the accelerator structure resonance, by minimizing the phase difference. The output of VCO 26 is applied to PIN attenuator (varactor) 30 through 1 watt amplifier 28. The output of PIN attenuator 30 is applied to driver klystron 34 through Attenuator/Switches/Filter module 32.

MTG 42 produces electrical synchronization pulses that coordinate the action of all pulsed sub-systems. MTG 42 is interfaced with and under supervisory control of PLC 24. The 1.3 GHz drive from VCO 26 is gated to drive klystron 34 by rf switches in Attenuator/Switch/Filter module 32 under the control of MTG 42. Beam pulse width can be varied between 40 and 1000 μs and pulse repetition rate between 1 and 500 pulses per second. Driver klystron 34 delivers rf power to high power klystron 18 at 1.3 GHz at a pulse power level of about 100 and 200 watts. High power klystron 18 amplifies the rf power to about 2.5 MW peak.

Figure 4:
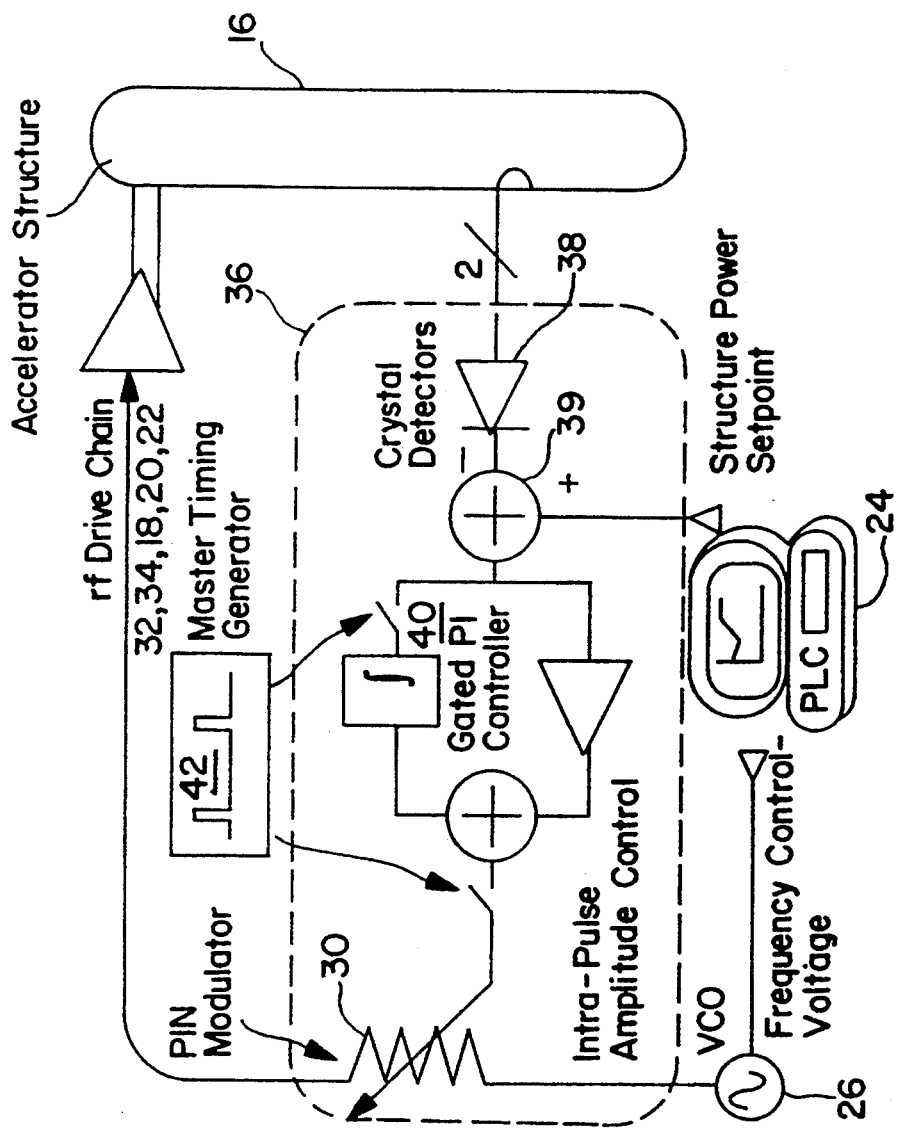
FIG. 4 is a schematic diagram of the fast feedback control of rf drive.

Because of the use of long pulse lengths, variations in delivered beam will result unless active control measures are taken. The long pulse length provides sufficient time to permit-regulation of the drive power on an intra-pulse basis. The energy gained by electrons traversing accelerator structure 16 is the line integral of the electric field. The amplitude of the electric field is controlled by fast amplitude controller 36. Referring to FIG. 4, magnetic field probes sample the power from the cavity of accelerating structure 16. Crystal detectors 38 convert the rf signals from probes 30 into amplitude envelopes which are averaged and compared in phase comparators 39 with a setpoint supplied by PLC 24. Gated Proportional-Integral (PI) Controller 40 processes this amplitude error signal to produce the required setting for PIN attenuator 30 which is in line with the rf drive chain. Thus, the drive power is automatically adjusted to bring the accelerator structure fields to the desired amplitude.

Gated PI Controller 40 forms the heart of the fast feedback control loop. Wideband (6 MHz) proportional control provides rapid correction for small disturbances, while over a period of a few microseconds, a gated integrator corrects larger disturbances and drift. Optimum performance requires a high gain integral term. To achieve this without overshoot, gated PI controller 40 employs inter-pulse memory and staged deployment of controller terms. A portion of the end-of-pulse integral control term is stored for use as the initial value with the next pulse. Part of the integral term is dropped between pulses to account for the gain droop across a pulse resulting from sag in the high-voltage supply for klystron 18. Fast, smooth pulse turn-on is accomplished by first applying the drive power as stored in the integrator memory and engaging only the proportional control action. After a few microseconds, the integral term is engaged. Thus the integrator acts only when the field is close to the desired strength and upsets at the leading edge of each pulse are avoided.

Figure 5:
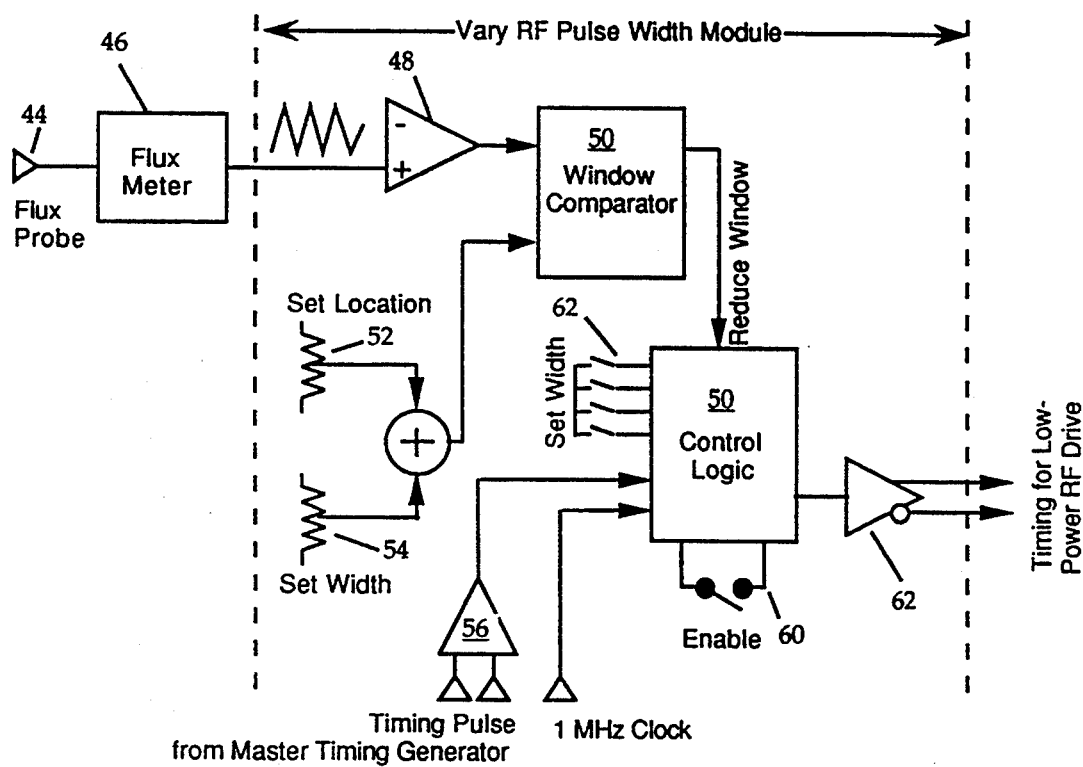
FIG. 5 is a block diagram of a module for varying the pulse width of the rf drive pulse in accordance with the present invention.

The use of long pulse lengths and fast feedback control of accelerator fields permits the above described linear accelerator to use pulse width as an independently variable parameter to control beam power. FIG. 5 illustrates a module that permits beam power to be controlled as a function of scan position. Magnetic field probe 44 is positioned in the magnet gap of scan magnet 4. The output of probe 44 is applied to flux meter 46 which allows the position of the electron beam in the scan to be observed. The flux probe output is buffered by amplifier 48 and fed to window comparator 50. The thresholds for window comparator 50 is set by two independent potentiometers 52 and 54. Potentiometer 52 sets the location on the scan and potentiometer 54 sets the width. The output of window comparator 50, will assume the true condition when the output of amplifier 48 (which is indicative of scan position) is within the upper and lower threshold set by window comparator 50. The rf timing pulses from MTG 42 are applied to differential optically isolated timing receiver 56, the output of which is applied to control logic module 58. Under normal operation, the rf timing pulses pass through control logic module 58 and are applied to Attenuator/Switches Filter module 32 and drive klystron 34 as described above. With enable switch 60 closed, and the output of window comparator 50 is true, each rf timing pulse will initiate a 100 KHz counter in control logic module 58. When the count reaches the preset value as set by pulse width control switch 62, control logic module 58 terminates the rf pulse by blocking its output. Accordingly, the delivered dose over a predetermined portion of the scan is varied by pulse width modulation of the rf pulse.

Figure 6:
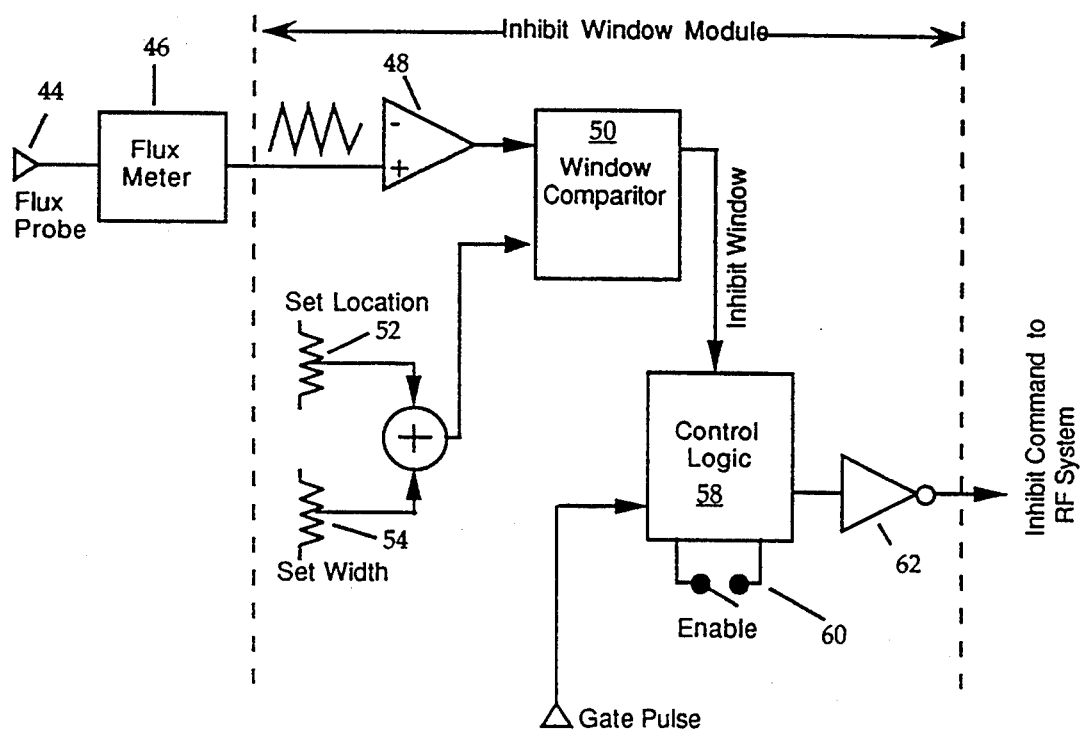
FIG. 6 is a block diagram of a module for inhibiting an rf drive pulse in accordance with the present invention.

FIG. 6 illustrates an alternative method and apparatus for modulating the rf drive pulse. Rather than modulating the width rf pulses that fall within the window defined by the settings on potentiometers 52 and 54, the module illustrated in FIG. 6 inhibits all rf pulses that fall within the window. The module operates in the same general manner as that of FIG. 5 except that a gate pulse generated by MTG 42 that is synchronic with the rf timing pulse is applied, along with the output of window comparator 50 directly to a simple logic gate in control logic module 58. In normal operation, with switch 60 in the open position, the gate pulse is blocked by control logic module 58. With enable switch 60 closed and the window comparator output true, the gate pulse is gated through output amplifier 62 and is used to turn of the rf drive in Attenuator/Switch/Filter module 32. Accordingly, the delivered dose over a predetermined portion of the scan is varied by rf pulse blanking.

It will be understood that the invention can be successfully practiced on a short pulse accelerator. Pulse inhibit can be easily achieved whereas pulse width modulation is more difficult to incorporate. Conventional short pulse industrial rf linear accelerators transmit rf energy to the accelerator in an open loop mode. In this mode, sustained beam current will load the rf power supply and result in a reduction of rf field ion the accelerator and hence a change in energy. Accordingly, in applying the present invention to short pulse systems, care must be taken to ensure tight energy tolerances and the pulse length is limited to the capacity of the power supply which limits ultimate average beam power. Power supplies that use a time average of many pulses to determine a setpoint on the power supply and other power supplies that are susceptible to changes in pulse repetition rate are not suitable.

Figure 7:
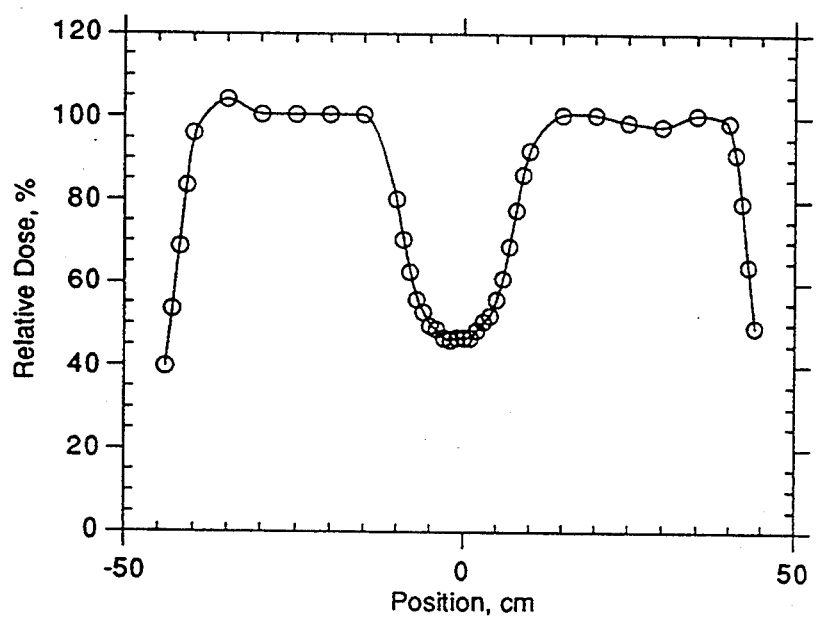
FIG. 7 is a dose profile produced by reducing pulse width 50% for 20% of the scan width in accordance with one embodiment of the present invention.
Figure 8:
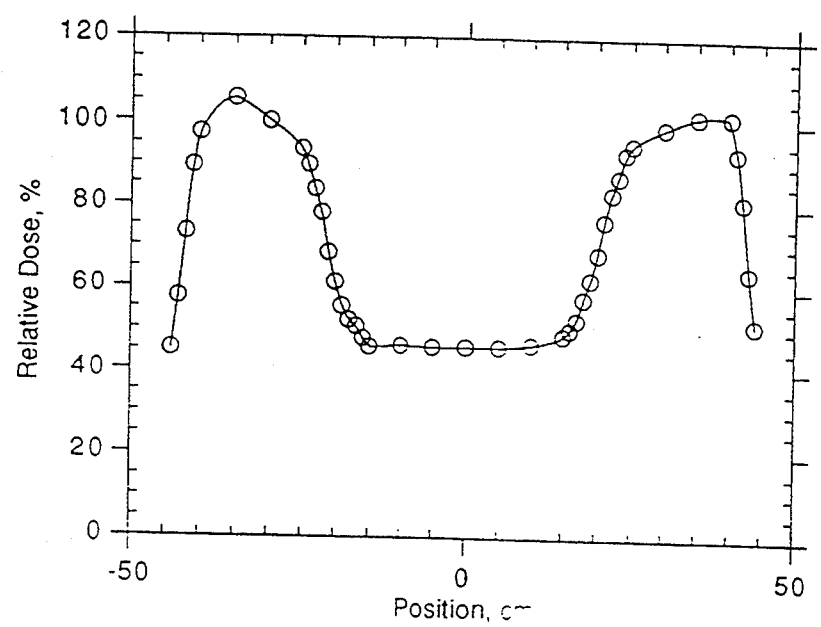
FIG. 8 is a dose profile produced by reducing pulse width 50% for 50% of the scan width in accordance with one embodiment of the present invention.
Figure 9:
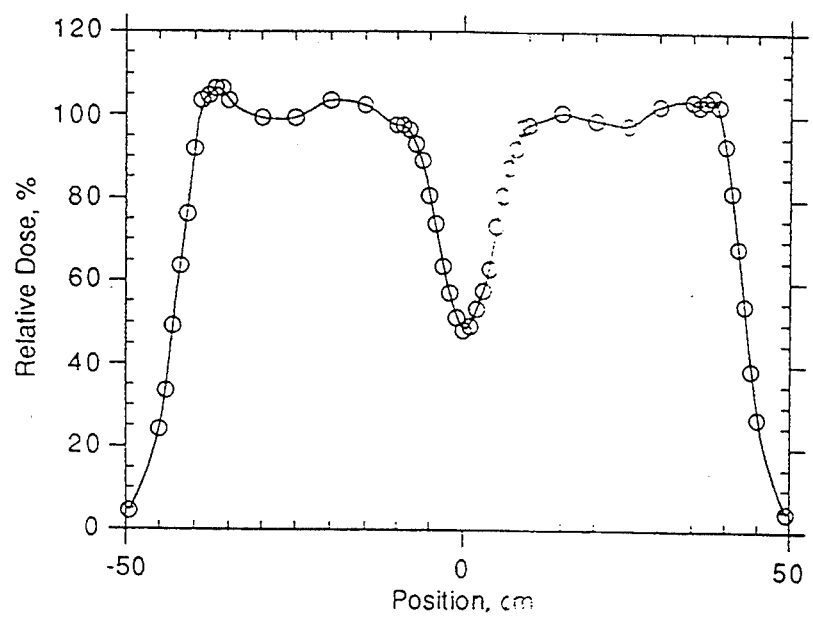
FIG. 9 is a dose profile produced by inhibiting a single pulse in the centre of the scan width in accordance with one embodiment of the present invention.
Figure 10:
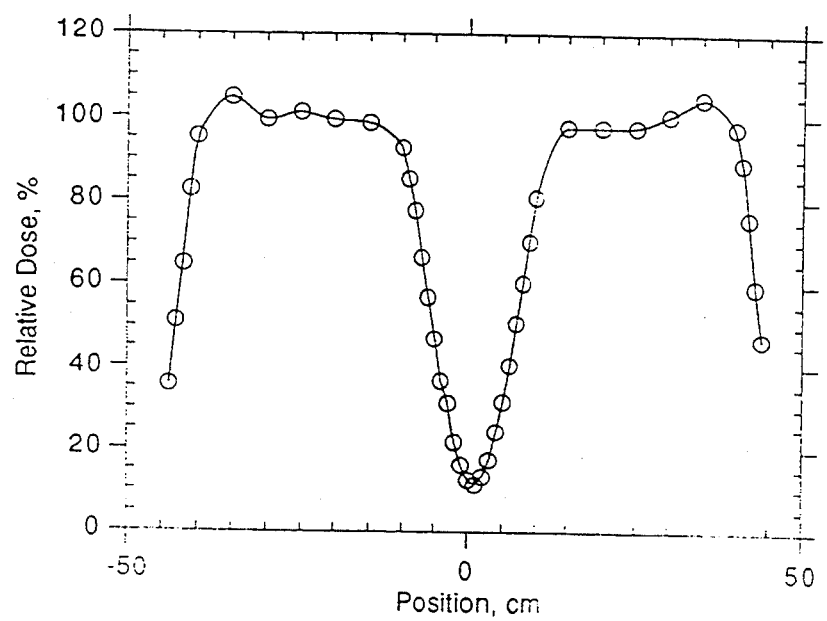
FIG. 10 is a dose profile produced by inhibiting four pulses in the centre of the scan width in accordance with one embodiment of the present invention.

In order to test dose control in accordance with the present invention, the absorbed dose profile over the scan in an aluminum phantom was measured using the modules of FIGS. 5 and 6. FIG. 7 shows the absorbed dose profile when the module of FIG. 5 was used to reduce the pulse width of the rf pulses by 50% over the central 20% of the scan width. As can be seen from the profile, the absorbed dose over the central 20% was reduced to about 50% of the value in the other portions of the scan. FIG. 8 shows the absorbed dose profile when the module of FIG. 5 was used to reduce the pulse width of the rf pulses by 50% over the central 50% of the scan width. As can be seen from the profile, the absorbed dose over the central 50% was reduced to about 50% of the value in the other portions of the scan. FIG. 9 shows the absorbed dose profile when the module of FIG. 6 was used to inhibit one rf pulse in the centre of the scan width. As can be seen from the profile, the absorbed dose in the centre of the scan was reduced to about 50% of the value in the other portions of the scan. FIG. 10 shows the absorbed dose profile when the module of FIG. 6 was used to inhibit four rf pulses in the centre of the scan width. As can be seen from the profile, the absorbed dose in the centre of the scan was reduced to about 10% of the value in the other portions of the scan.

Figure 11:
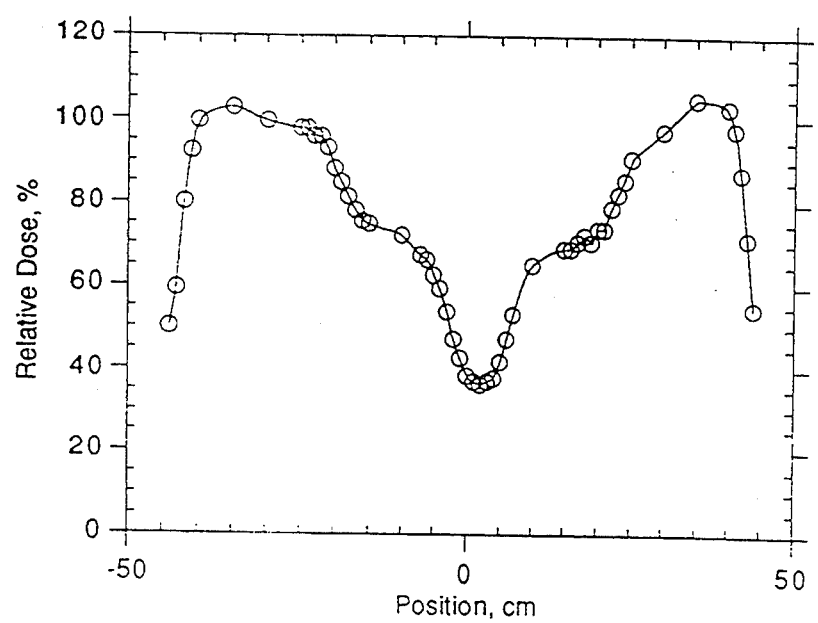
FIG. 11 is a dose profile produced by reducing pulse width 50% for 50% of the scan width and inhibiting a single pulse in the centre of the scan width in accordance with one embodiment of the present invention.

To illustrate the flexibility of the system, the effects of pulse width modulation and pulse inhibiting were combined. FIG. 11 shows the absorbed dose profile when the modules of FIGS. 5 and 6 were used to reduce the pulse width of the rf pulses by 50% over the central 50% of the scan width and to inhibit one rf pulse in the centre of the scan width. As can be seen from FIG. 11, a relatively complex absorbed dose profile can be easily accomplished with the present invention.

It will be evident from the foregoing that a non-uniform dose profile can be generated and may be tailored to a specific product. Furthermore, the beam can be altered on-line through the control system. In conjunction with a product identification system, automation is readily achieved through pre-programmed beam profiles. Although specific modules to achieve pulse width modulation and pulse inhibiting have been described above, those skilled in the art will understand that other methods of controlling or inhibiting rf pulses can be used without departing from the scope of the invention.

What is claimed is:

1. A method for controlling the delivered dose across a target area from an electron beam produced by a high energy, high power pulsed rf linear accelerator comprising the steps of:
   scanning the electron beam across a target area at a scan frequency effective to produce a series of irradiated spots across the target area;
   sensing the scan position;
   varying the width of the rf drive pulses as a function of scan position to control the delivered dose distribution across said target area.

2. The method of claim 1 including the the steps of:
   operating the accelerator in a long pulse mode;
   sensing the rf field intensity in the accelerator and using fast feedback control to maintain uniform rf field intensity on an intra-pulse basis.

3. The method of claim 2 wherein the width of the rf drive pulses is varied as a function of scan position by the steps of:
   developing a scan signal the value of which is representative of scan position;
   comparing said scan signal value to predetermined upper and lower values and producing a logical output when said scan signal value is within said upper and lower values;
   applying said logical output to enable a counter, applying an rf drive pulse to initiate said counter, gating said rf drive pulse through said counter and blocking said rf drive pulse when said counter reaches a predetermined value.

4. A method for controlling the delivered dose across a target area from an electron beam produced by a high energy, high power pulsed rf linear accelerator comprising the steps of:
   scanning the electron beam across a target area at a scan frequency effective to produce a series of irradiated spots across the target area;
   sensing the scan position;
   inhibiting at least one rf drive pulse as a function of scan position to control the delivered dose distribution across said target area.

5. The method of claim 4 including the steps of:
   operating the accelerator in a long pulse mode;
   sensing the rf field intensity in the accelerator and using fast feedback control to maintain uniform rf field intensity on an intra-pulse basis.

6. The method of claim 5 wherein the at least one rf drive pulse is inhibited as a function of scan position by the steps of:
   developing a scan signal the value of which is representative of scan position;
   comparing said scan signal value to predetermined upper and lower values and producing a logical output when said scan signal value is within said upper and lower values;
   applying said logical output to block said rf drive pulse.

7. The apparatus of claim 5 including;
   an rf drive train capable of driving said accelerator with long pulses between about 40 and 1000 $\mu$s;
   means for sensing the rf field intensity in the accelerator and producing a signal proportional thereto;
   fast feedback control means responsive to said rf field intensity signal effective to vary the amplitude of the rf drive so as to maintain uniform field strength on an intra-pulse basis;

8. The apparatus of claim 7 including:
   means for developing a scan signal the value of which is representative of scan position;
   means for comparing said scan signal value to predetermined upper and lower values and producing a logical output when said scan signal value is within said upper and lower values; and
   counter means enabled by said logical output and initiated by each said rf drive pulse for applying said rf drive pulse to the rf drive and blocking said rf drive pulse when said counter reaches a predetermined value.

9. An apparatus for controlling the delivered dose across a target area from an electron beam produced by a high energy, high power pulsed rf linear accelerator comprising;
   means for scanning the electron beam across a target area at a scan frequency effective to produce a series of irradiated spots across the target area;
   means for sensing the scan position;
   means for varying the width of the rf drive pulses as a function of scan position to control the delivered dose distribution across said target area.

10. The apparatus of claim 9 including;

means for developing a scan signal the value of which is representative of scan position;

means for comparing said scan signal value to predetermined upper and lower values and producing a logical output when said scan signal value is within said upper and lower values; and means for applying said logical output to block said rf drive pulse.

11. The apparatus of claim 10 including:

an rf drive train capable of driving said accelerator with long pulses between about 40 and 1000 μs;

means for sensing the rf field intensity in the accelerator and producing a signal proportional thereto; and fast feedback control means responsive to said rf field intensity signal effective to vary the amplitude of the rf drive so as to maintain uniform field strength on an intra-pulse basis.

12. An apparatus for controlling the delivered dose across a target area from an electron beam produced by a high energy, high power pulsed rf linear accelerator comprising;

means for scanning the electron beam across a target area at a scan frequency effective to produce a series of irradiated spots across the target area;

means for sensing scan position; and means for inhibiting at least one rf drive pulse as a function of scan position to control the delivered dose distribution across said target area.

* * * * *